(12) United States Patent
Hyun et al.

(10) Patent No.: US 12,051,629 B2
(45) Date of Patent: Jul. 30, 2024

(54) SEMICONDUCTOR DEVICE MANUFACTURING SYSTEM, SEMICONDUCTOR DEVICE INSPECTION DEVICE, AND SEMICONDUCTOR DEVICE MANUFACTURING METHOD

(71) Applicant: SAMSUNG ELECTRONICS CO., LTD., Suwon-si (KR)

(72) Inventors: Seunghwa Hyun, Suwon-si (KR); Younghwan Kim, Seoul (KR); Hwayoung Park, Hwaseong-si (KR); Youngsu Ryu, Suwon-si (KR); Yusang Cheon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 1168 days.

(21) Appl. No.: 16/825,512

(22) Filed: Mar. 20, 2020

(65) Prior Publication Data

US 2021/0066140 A1 Mar. 4, 2021

(30) Foreign Application Priority Data

Sep. 2, 2019 (KR) .......................... 10-2019-0108456

(51) Int. Cl.
| | |
|---|---|
| *H01L 21/66* | (2006.01) |
| *B05D 1/00* | (2006.01) |
| *G01N 21/95* | (2006.01) |
| *G03F 7/16* | (2006.01) |
| *H01L 21/67* | (2006.01) |

(52) U.S. Cl.
CPC ............. *H01L 22/12* (2013.01); *B05D 1/005* (2013.01); *G01N 21/9503* (2013.01); *G03F 7/162* (2013.01); *H01L 21/67023* (2013.01)

(58) Field of Classification Search
CPC ............................ G01N 21/9503; G03F 7/162
See application file for complete search history.

(56) References Cited

U.S. PATENT DOCUMENTS

| | | | | |
|---|---|---|---|---|
| 5,095,848 | A | * | 3/1992 | Ikeno ................ H01L 21/67023 118/54 |
| 7,289,661 | B2 | | 10/2007 | Jun et al. |
| 7,652,276 | B2 | | 1/2010 | Hayakawa et al. |

(Continued)

FOREIGN PATENT DOCUMENTS

| | | |
|---|---|---|
| JP | 2000-292126 A | 10/2000 |
| JP | 5308934 B2 | 10/2013 |

(Continued)

OTHER PUBLICATIONS

Office Action in Korean Appln. No. 10-2019-0108456, mailed on Feb. 14, 2024, 21 pages (with English translation).

*Primary Examiner* — Yewebdar T Tadesse
*Assistant Examiner* — Stephen A Kitt
(74) *Attorney, Agent, or Firm* — Fish & Richardson P.C.

(57) ABSTRACT

A semiconductor device manufacturing system includes a spin coater and a coating layer inspector. The spin coater includes: a chuck, a rotation driver configured to rotate the chuck; and a solution dispenser configured to spray a solution onto a portion of the coating layer formed on an edge portion of the wafer, wherein the coating layer inspector includes an edge inspection camera and an inspection controller configured to determine a radius, eccentricity, and a top-view shape of the coating layer, based on images of the edge portion of the wafer.

6 Claims, 19 Drawing Sheets

(56) References Cited

U.S. PATENT DOCUMENTS

| | | |
|---|---|---|
| 7,935,217 B2 | 5/2011 | Yashiki et al. |
| 8,089,622 B2 | 1/2012 | Birkner et al. |
| 8,492,178 B2 | 7/2013 | Carlson et al. |
| 9,064,922 B2 | 6/2015 | Nakajima et al. |
| 10,112,205 B2 | 10/2018 | Inagaki |
| 2003/0030050 A1 | 2/2003 | Choi |
| 2003/0057384 A1 | 3/2003 | Fukazawa |
| 2006/0262295 A1 | 11/2006 | Backhauss et al. |
| 2011/0054659 A1* | 3/2011 | Carlson ............. H01L 21/67253 700/109 |
| 2017/0243738 A1* | 8/2017 | Noda .................. H01L 21/6715 |
| 2017/0278236 A1 | 9/2017 | Li et al. |

FOREIGN PATENT DOCUMENTS

| | | |
|---|---|---|
| KR | 10-2001-0044250 | 6/2001 |
| KR | 10-2017-0098695 | 8/2017 |

* cited by examiner

SEMICONDUCTOR DEVICE MANUFACTURING SYSTEM, SEMICONDUCTOR DEVICE INSPECTION DEVICE, AND SEMICONDUCTOR DEVICE MANUFACTURING METHOD

CROSS-REFERENCE TO THE RELATED APPLICATION

This application is based on and claims priority under 35 U.S.C. § 119(a) from Korean Patent Application No. 10-2019-0108456, filed on Sep. 2, 2019, in the Korean Intellectual Property Office, the disclosure of which is incorporated herein in its entirety by reference.

BACKGROUND

The disclosure provides a semiconductor device manufacturing system, a semiconductor device inspection apparatus, and a semiconductor device manufacturing method.

To manufacture semiconductor devices, various processes such as oxidation processes, photolithography, etching, thin-layer deposition, metallization, electrical die sorting (EDS), and packaging are performed on a wafer. As semiconductor devices become more miniaturized, the necessity for precise control of semiconductor processes is increasing. Among the processes, the importance of lithography processes for drawing circuit patterns on wafers has been highlighted. A lithography process is a process of transferring a designed pattern which constitutes a semiconductor element onto a photosensitive photoresist layer. Accordingly, the quality of the photoresist layer is one of the key factors in improving production yield and reducing production costs by increasing the number of chips per wafer. Recently, various studies have been conducted to improve the reliability of a spin coating process of the photoresist layer and to monitor spin coating process and the photoresist layer in real time.

SUMMARY

The disclosure provides semiconductor device manufacturing system having improved reliability, a semiconductor device inspection device, and a semiconductor device manufacturing method.

The novel and technical aspects of the disclosure are not limited to addressing or solving the above-mentioned issues, and other issues not mentioned may be clearly understood by those of ordinary skill in the art from the following description.

According to an aspect of the disclosure, there is provided a semiconductor device manufacturing system comprising: a spin coater configured to form a coating layer on a wafer; and a coating layer inspector configured to inspect the coating layer, wherein the spin coater comprises: a chuck configured to support the wafer; a coating material dispenser configured to provide a coating material to a top surface of the wafer; a rotation driver configured to rotate the chuck such that the coating material is coated on the wafer to form the coating layer; and a solution dispenser configured to dispense a solution to a portion of the coating layer formed on an edge portion of the wafer, wherein the coating layer inspector comprises: an edge inspection camera configured to obtain a plurality of images of edge portions of the wafer; and an inspection controller configured to identify one of a radius, eccentricity, or a top-view shape of the coating layer, based on the plurality of images of the edge portions of the wafer.

According to another aspect of the disclosure, there is provided a coating layer inspector comprising: a rotation stage configured to support and rotate a wafer, the wafer having a top surface on which a coating layer is formed; an edge inspection camera configured to obtain a plurality of images of edge portions of the wafer, the edge portions corresponding to a plurality of azimuths of the wafer; and a coating layer inspector configured to: identify exclusion widths with respect to the plurality of azimuths on the wafer based on the plurality of images of the edge portions, the exclusion widths being widths in a radial direction of portions of the top surface of the wafer that is not covered by the coating layer; and identify, based on the exclusion widths and the plurality of azimuths, a shape of at least a portion of the coating layer in a top-view.

According to an aspect of the disclosure, there is provided a semiconductor device manufacturing method, the method comprising: mounting a wafer on a chuck; forming a coating layer on the wafer by using a spin coating process; performing an edge bead removal (EBR) operation of removing a portion of the wafer formed on an edge portion of the coating layer by dispensing a solution onto an edge portion of the wafer such that the edge portion of the wafer is exposed; obtaining the coating layer corresponding to a plurality of azimuths of the wafer and a plurality of images of the edge portion of the wafer; based on the plurality of images, identifying exclusion widths corresponding to the plurality of azimuths of the wafer, the exclusion widths being radial widths of portions of the coating layer removed by the EBR operation; and generating a feedback signal based on a shape of a contour line of the coating layer based on the plurality of azimuths and the exclusion widths.

According to an aspect of the disclosure, there is provided an apparatus comprising: a memory storing one or more instructions; and a processor configured to execute the one or more instructions to: obtain a plurality of images of edge portions of a wafer provided on a chuck, the edge portions corresponding to a plurality of azimuths of the wafer; identify exclusion widths with respect to the plurality of azimuths on the wafer based on the plurality of images of the edge portions, the exclusion widths corresponding to portions of a top surface of the wafer that is not covered by a coating layer; identify, based on the exclusion widths and the plurality of azimuths, a feature of at least a portion the coating layer in a top view; and generate a control signal to adjust a process for forming the coating layer based on the feature of the at least the portion the coating layer in the top view.

BRIEF DESCRIPTION OF THE DRAWINGS

Embodiments of the disclosure will be more clearly understood from the following detailed description taken in conjunction with the accompanying drawings in which.

DETAILED DESCRIPTION OF THE EMBODIMENTS

Figure 1:
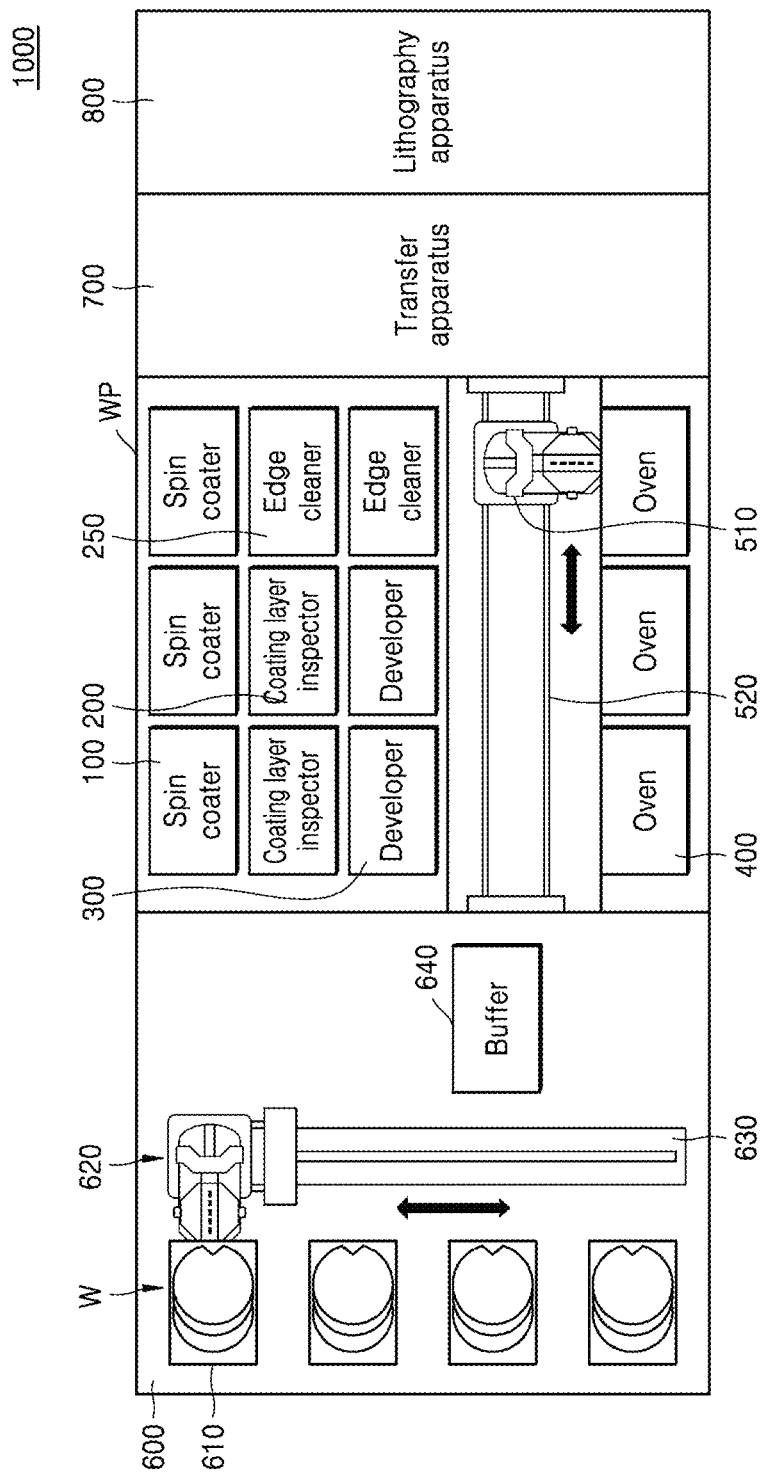
FIG. 1 is a schematic diagram of a semiconductor device manufacturing system, according to example embodiments.

Hereinafter, example embodiments of the disclosure will be described in detail with reference to the accompanying drawings. Identical reference numerals are used for the same constituent elements in the drawings, and a duplicate description thereof will be omitted. In the following drawings, a thickness or size of each layer is exaggerated for convenience and clarity of description, and thus may differ from an actual shape or ratio.

FIG. 1 is a block diagram of a semiconductor device manufacturing system 1000, according to example embodiments.

Referring to FIG. 1, the semiconductor device manufacturing system 1000 may include, for example, a spinner device. The semiconductor device manufacturing system 1000 may include a wafer loader 600, a wafer processing apparatus WP, a transfer apparatus 700, and a lithography apparatus 800. According to an embodiment, the semiconductor device manufacturing system 1000 may further include a monitoring control system for controlling each component included in the semiconductor device manufacturing system 1000 and the overall processes, and monitoring results of the processes. The semiconductor device manufacturing system 1000 may perform processes of forming a coating layer on wafers W, exposing the coating layer, and developing the exposed coating layer.

The wafer loader 600 may include a plurality of load ports 610, an index robot 620, a transfer rail 630, and a buffer 640. The plurality of load ports 610 may accommodate the wafers W. The index robot 620 may move along the transfer rail 630. The index robot 620 may transfer the wafers W accommodated in the load ports 610 to the buffer 640.

The wafers W may include, for example, silicon (Si). The wafers W may include a semiconductor element such as germanium (Ge), or a compound semiconductor such as silicon carbide (SiC), gallium arsenide (GaAs), and indium arsenide (InAs). According to example embodiments, the wafers W may have a silicon on insulator (SOI) structure. The wafers W may include buried oxide layers. According to example embodiments, the wafer W may include a conductive region, for example, a well doped with impurities. According to example embodiments, the wafers W may have various device isolation structures such as a shallow trench isolation (STI) that separates the doped wells apart from each other.

The wafer W may include a notch for identifying a direction. The wafer W may have an approximately disc shape when viewed from above. In some cases, the wafer W may further include an additional indicator to indicate a dopant type.

The wafer processing apparatus WP may include a plurality of apparatuses that perform a series of processes on the wafers W. The wafer processing apparatus WP may include a plurality of spin coaters 100, a plurality of coating layer inspectors 200, a plurality of edge cleaners 250, a plurality of developers 300, a plurality of baking ovens 400, a transfer robot 510, and a transfer rail 520.

For convenience of illustration, a plurality of components included in the wafer processing apparatus WP are illustrated as being horizontally apart from each other, but the specific arrangement of the plurality of components are limited to the illustrated in FIG. 1. For instance, according to other example embodiments, the same components may constitute a stacked structure (for example, the plurality of baking ovens 400 are stacked on each other), or different components may constitute a stacked structure (for example, the coating layer inspector 200 and/or the developers 300 are stacked on the spin coaters 100).

The transfer robot 510 may move along the transfer rail 520, and transfer the wafers W from the buffer 640 to at least one of the plurality of spin coaters 100, the plurality of coating layer inspectors 200, and the plurality of edge cleaners 250, the plurality of developing units 300, and the plurality of baking ovens 400. The transfer robot 510 may transfer the wafers W between the plurality of spin coaters 100, the plurality of coating layer inspectors 200, the plurality of edge cleaners 250, the plurality of developers 300, and the plurality of baking ovens 400. The transfer robot 510 may transfer the wafers W on which a series of processes for exposure have been performed to the transfer apparatus 700.

The plurality of spin coaters 100 may perform a process of forming a coating layer (CTL, refer to FIG. 2B) by coating a coating material on the wafers W. The plurality of spin coaters 100 may further perform an edge bead removal (EBR) process for removing edge beads (EB, refer to FIG. 2B) of the coating layer CTL. The CTL may include, for example, a photoresist layer.

However, the example embodiments are not limited thereto, and the spin coating process and the EBR process may be performed by different apparatuses. In the following description, the spin coaters 100 may be configured to perform both the spin coating process and the EBR process. However, those of ordinary skill in the art may be able to easily apply the technical aspect of the disclosure to a case where a separate apparatus for performing the EBR process other than the spin coater is provided.

For convenience of explanation, hereinafter, the layer formed by the spin coaters 100 may be the photoresist layer. However, those of ordinary skill in the art may readily apply the example embodiments described below even to the case where materials other than the photoresist are coated on the wafer W. For example, the coating layer CTL may include, in addition to the photoresist, any one of an organic planarization layer under the photoresist layer, an anti-reflection coating, a top coating on the photoresist layer, and a combination thereof.

The plurality of coating layer inspectors 200 may inspect the coating layer CTL (refer to FIG. 2C) formed on the wafers W. The plurality of coating layer inspectors 200 may inspect the presence of defects and an edge shape of a front surface of the coating layer CTL (refer to FIG. 2C). The plurality of coating layer inspectors 200 may determine a radius (CTR, refer to FIG. 2C), eccentricity, etc. of the coating layer CTL (refer to FIG. 2C) by determining a contour of the coating layer CTL seen from above (refer to FIG. 2C) and fitting the contour. The plurality of coating layer inspectors 200 may determine whether the coating layer CTL (refer to FIG. 2C) has an elliptic shape, and a major semi-axis or a minor semi-axis of the elliptic shape. The plurality of spin coaters 100 and the plurality of coating layer inspectors 200 are described in more detail later.

The plurality of edge cleaners 250 may include a type of laser. The plurality of edge cleaners 250 may trim a circumference of the control layer CTL (for example, the photoresist layer) based on an inspection result of the coating layer inspectors 200. Since the EBR process is a cleaning process by spraying a solution SOL (refer to FIG. 2C), controllability of the EBR process may be somewhat lacking, and the control layer CTL (for example, the photoresist layer) formed by the EBR process may have an irregular circumferential profile. The plurality of edge cleaners 250 may irradiate a laser beam to irregular edge portions of the control layer CTL (for example, the photoresist layer). As a result, an edge profile of the control layer CTL (for example, the photoresist layer) may be smoothened. Since an edge cleaning process is capable of preventing particle contamination and the like due to separation of materials included in the CTL (for example, the photoresist layer), reliability of the semiconductor device manufacturing may be improved.

In FIG. 1, the edge cleaners 250 are illustrated as being provided in a separate configuration, but are not limited thereto. The edge cleaners 250 may be included in the coating layer inspectors 200, or may be included in the baking ovens 400.

The plurality of developing units 300 may perform a developing process on a substrate on which an exposure process is completed. The developing process may be a process for removing exposed or unexposed portions of the coating layer CTL. The developing process may include spraying developer onto the wafer W and then spinning the wafer W to coat the developer evenly over the entire surface of the wafer W, or immersing the wafer W in the developer for a certain time. According to an example embodiment, the certain time is a predetermined time. The exposed portion (or non-exposed portion) of the control layer CTL (for example, the photoresist layer) may be removed by the developing process. After the developing process, a washing process by using de-ionized water or the like may be further performed to remove contaminated particles.

The plurality of baking ovens 400 may perform a bake process of heat treating the substrate. The plurality of baking ovens 400 may each include a bake plate and a chill plate. The bake plate may heat the wafers W to a certain temperature and for a certain time, and the chill plate may cool the wafers W heated in the bake plate down to an appropriate temperature. According to an embodiment, the certain temperature is a predetermined temperature.

The baking ovens 400 may perform soft bake, post exposure bake (PEB), and hard bake. The soft bake, also referred to as pre-bake, may be a process for removing organic solvent remaining in the control layer CTL (for example, the photoresist layer), and for strengthening bonding between the CTL (for example, the photoresist layer) and the wafer W. The soft bake process may be performed at a relatively low temperature.

The PEB may be a process for flattening a curvature formed on the surface of the photoresist layer, as intensity of light becomes uneven across the wafer due to a standing wave formed during the exposure. The PEB may activate a photo-active compound (PAC) contained in the photoresist layer, and accordingly, the curvature formed on the photoresist layer may be reduced.

The hard bake may be a process for improving durability against etching and for increasing adhesion to the wafers W (or an underlying layer) by curing the photoresist after performing the exposure and development processes. The hard bake process may be performed at a relatively high temperature as compared to the soft bake process.

The transfer apparatus 700 may include a buffer in which the wafers W are stored before and after performing of the exposure by the lithographic apparatus 800. The transfer apparatus 700 may transfer the wafers W, on which the series of processes for the exposure (for example, spin coating, EBR, and soft bake) have been performed, to the lithographic apparatus 800, and may transfer the wafers W on which the exposure has been completed to the wafer processing apparatus WP.

The lithographic apparatus 800 may perform an extreme ultraviolet (UV) (EUV) lithography process. The lithographic apparatus 800 may include a lithographic apparatus controller, a measuring station, and an exposure station.

The lithographic apparatus controller may include a signal and data processing capacity for performing a desired operation related to the operation of the lithographic apparatus 800. The measurement station may perform measurements of the wafers W before the exposure is performed. The measuring station may map a surface height of the wafers W, and measure a position of an alignment mark on the wafers W. The alignment mark may have, for example, a box in box structure or a diffraction grating structure.

The lithographic apparatus 800 may include a dual stage type lithographic apparatus including two wafer tables. The two wafer tables may be for the measuring station and the exposure station, respectively. However, the embodiment is not limited thereto, and the lithographic apparatus 800 may include a mono stage type lithography apparatus including one wafer table.

The measurement of the wafer W prior to the exposure may include identification of the location of the alignment mark included in patterns formed on the wafers W for alignment during the exposure. The exposure process may be performed based on the identified location of the alignment mark.

The exposure station may include a projection system. The projection system may include a system for conditioning and focusing light for the exposure. The projection system may include any type of projection system including a refractive type, a reflective type, a cata-dioptric type, a magnetic type, an electromagnetic type, an electrostatic optical type, or a combination thereof.

In the exposure station, a table in which the exposure mask such as an EUV/deep UV (DUV) mask is mounted may be arranged. The EUV/DUV beam may be focused on the exposure mask by the projection system. The mask may be of either a transmission type or a reflection type, and patterning light in the exposure mask may reach the wafer W that is provided with the control layer CTL (for example, the photoresist layer). Accordingly, the pattern formed in the exposure mask may be transferred to the photoresist layer formed on the wafer W.

The wafers W reaching the lithographic apparatus 800 may be newly prepared wafers W or wafers W that have been previously processed in the lithographic apparatus 800 or other apparatus. The wafers W unloaded from the lithographic apparatus 800 may be reloaded for further exposure in the lithographic apparatus 800, may be patterned by the developer 300 or the like, or may be finished by a dicing and packaging process or the like.

In some other example embodiments, the semiconductor device manufacturing system 1000 may further include apparatuses for performing an ion implant process, a deposition process, and the like.

Figure 2A:
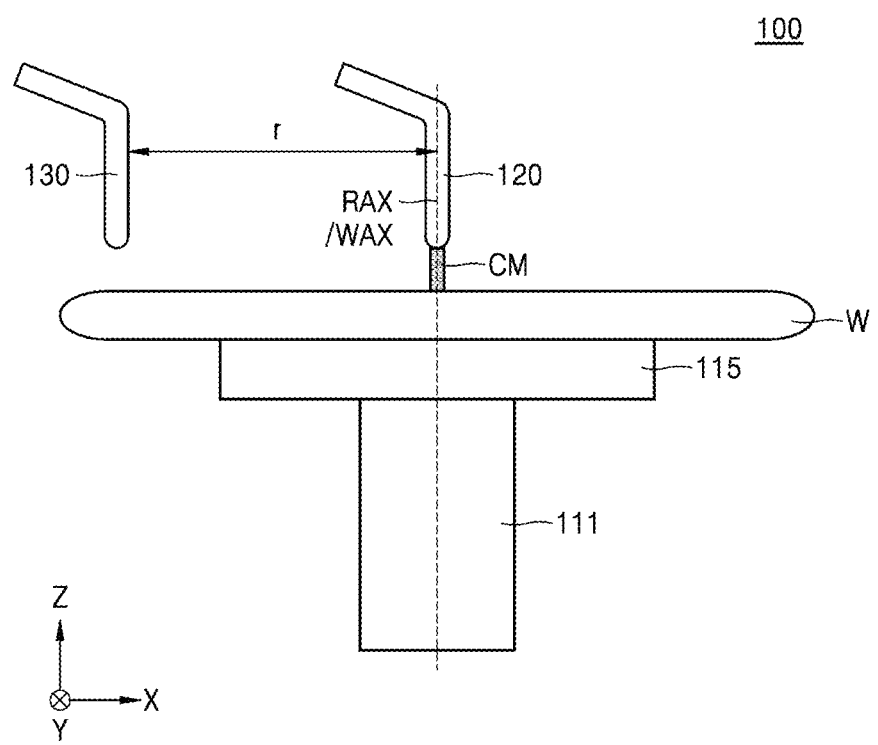
FIGS. 2A, 2B and 2C are cross-sectional views illustrating one of a plurality of spin coaters in FIG. 1.
Figure 2B:
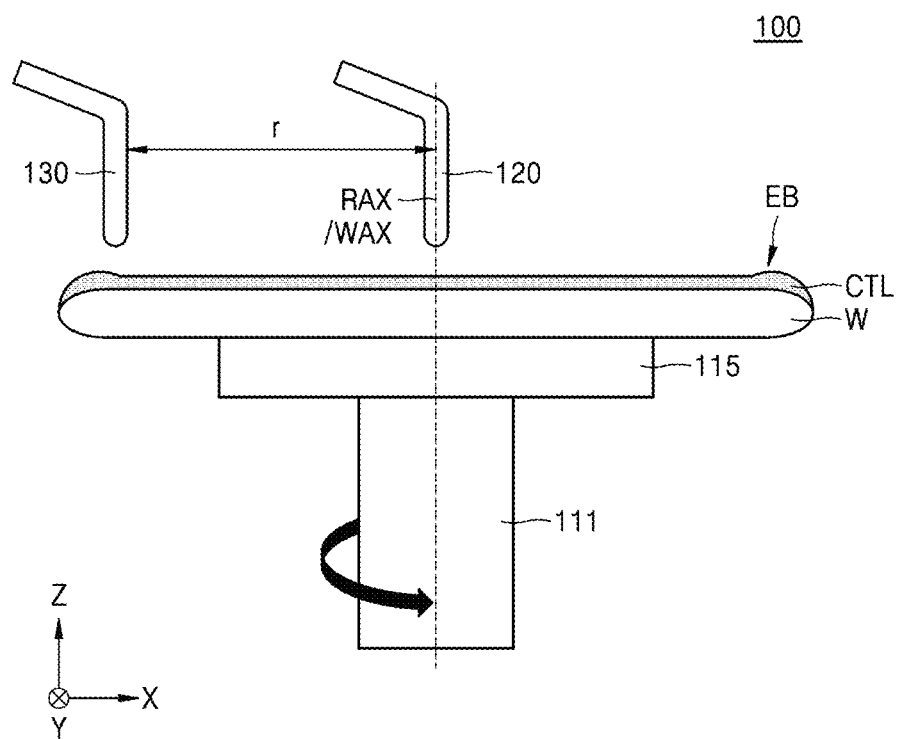
Figure 2C:
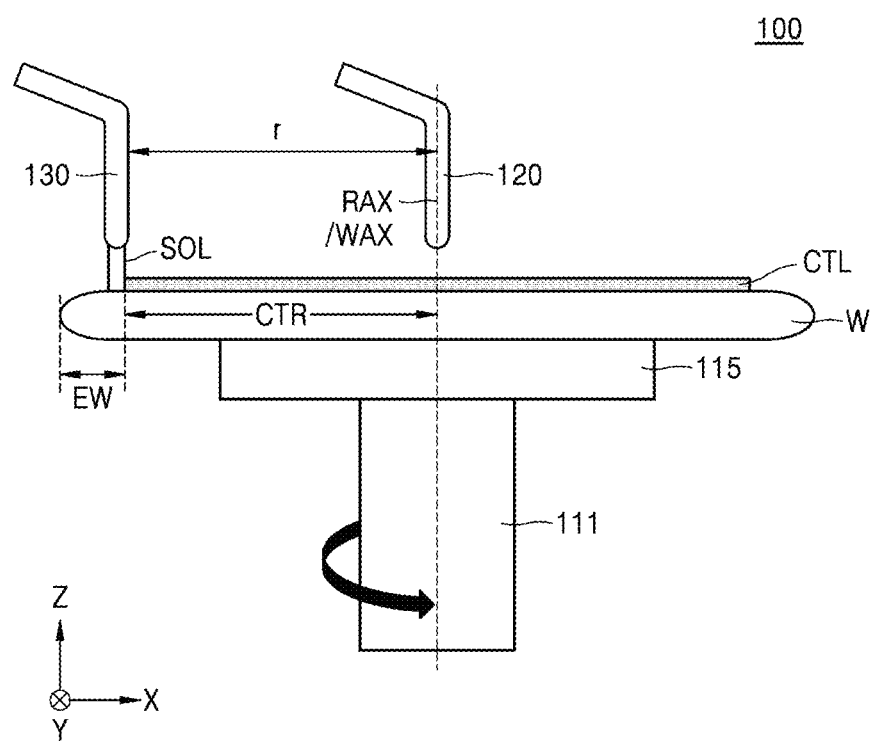

FIGS. 2A, 2B and 2C are cross-sectional views illustrating one of the plurality of spin coaters 100 in FIG. 1. FIGS. 2A, 2B and 2C illustrate in sequence operations of forming the control layer CTL by the spin coater 100.

Referring to FIGS. 2A, 2B and 2C, the spin coater 100 may include a rotation driver 111, a chuck 115, a coating material dispenser 120, and a solution dispenser 130.

The rotation driver 111 may rotate the chuck 115 at a set speed with respect to the rotation axis RAX.

The wafer W may be mounted on the chuck 115. The chuck 115 may include, for example, a vacuum chuck that fixes the wafer W at vacuum pressure, but is not limited thereto. For example, the chuck 115 may include an electrostatic chuck.

In FIG. 2A, the edge of the wafer W is illustrated as having a round shape, but is not limited thereto. The edge of the wafer W may have various shapes other than the round shape such as a shape of a beveled structure.

In FIGS. 2A, 2B and 2C, a direction perpendicular to a top surface of the wafer W is defined as a Z direction, and two directions parallel to and perpendicular to the top surface of the wafer W are defined as an X direction and a Y direction, respectively. The definition of directions may be the same in other drawings unless otherwise indicated.

For convenience of description, FIGS. 2A, 2B and 2C are described for the case where the wafer W and each component of the spin coater 100 are ideally arranged. For instance, i) the center of the mounted wafer W and the center of the chuck 115 may coincide with each other, ii) a center axis WAX passing through the center of the wafer W and perpendicular to the top surface of the wafer W may coincide with the axis of rotation RAX of the rotation driver 111, iii) the coating material dispenser 120 may be on the axis of rotation RAX, and iv) a position of the solution dispenser 130 may be apart from the axis of rotation RAX of the chuck RAX by a set radius r.

Referring to FIG. 2A, the coating material dispenser 120 may provide a coating material CM on the wafer W.

In FIG. 2A, the spin coater 100 is illustrated as including one of the coating material dispenser 120, but is not limited thereto. For example, the spin coater 100 may include a plurality of coating material dispensers according to a type of the coating material CM to be provided.

Referring to FIGS. 2A and 2B, by rotating the chuck 115 and the wafer W by the rotation driver 111, the coating material CM may be coated on the wafer W to form the coating layer CTL. After the coating layer CTL is formed, the rotation driver 111 may further rotate the chuck 115 for a certain time to dry the wafer W. According to an example embodiment, the certain time may be predetermined.

As illustrated in FIG. 2B, the coating layer CTL may include the edge bead EB. The edge bead EB may have a form of a bump, and may be formed by unwanted accumulation of the coating material CM at edge portions of the wafer W. The bead EB may cover entire edge of the wafer W along the circumference of the wafer, and may be further formed on a side surface and a bottom surface of the wafer W as well as the top surface thereof. The edge bead EB may interfere with the alignment of the exposure mask, or may partially be detached the wafer W after the coating layer CTL is dried, and cause particle contamination in subsequent processes.

Referring to FIG. 2C, the EBR process may be performed. During the EBR process, the solution dispenser 130 may inject the solution SOL to an edge portion of the wafer W. The solution dispenser 130 may be connected to a driving apparatus configured to adjust a position of the solution dispenser 130 with respect to the chuck 115. The driving apparatus may adjust the position of the solution dispenser 130 based on a feedback signal to be described later.

The edge bead EB (refer to FIG. 2B) may be removed by the solution SOL. According to example embodiments, an additional solution dispenser may be further provided to remove the coating material CM (refer to FIG. 2A) that may be on the bottom surface of the wafer W. While the solution SOL is provided, the rotation driver 111 may rotate the chuck 115. A radial width of the wafer W exposed by removing the coating layer CTL from the solution SOL may be referred to as an exclusion width EW. After an injection of the solution SOL is completed, the rotation driver 111 may further rotate the chuck 115 for a certain time to dry the wafer W.

In a series of processes described with reference to FIGS. 2A, 2B and 2C, a speed at which the rotation driver 111 rotates the chuck 115 may vary. In each of the process of forming the coating layer CTL, the process of drying the wafer W after forming the coating layer CTL, the process of performing the EBR process, and the process of drying the wafer (W) after the EBR process is completed, the rotation driver 111 may rotate the chuck 115 at different speeds.

As a chip size is gradually reduced, the number of chips produced from one of the wafer W may vary according to the exclusion width EW of the coating layer CTL. In the case of the wafer for forming a memory chip, a partial shot of transferring a portion of a pattern of an exposure mask to the coating layer CTL may be performed on the edge portion. When the exclusion width EW is too large, the number of chips produced in the wafer W may be reduced, or a portion of a circuit pattern constituting a chip may not be accurately transferred. On the other hand, when the exclusion width EW is too small to remove the edge bead EB, as described above, the alignment of the exposure mask may be interfered or the particle contamination may be generated, and may cause chip failure.

Figure 3A:
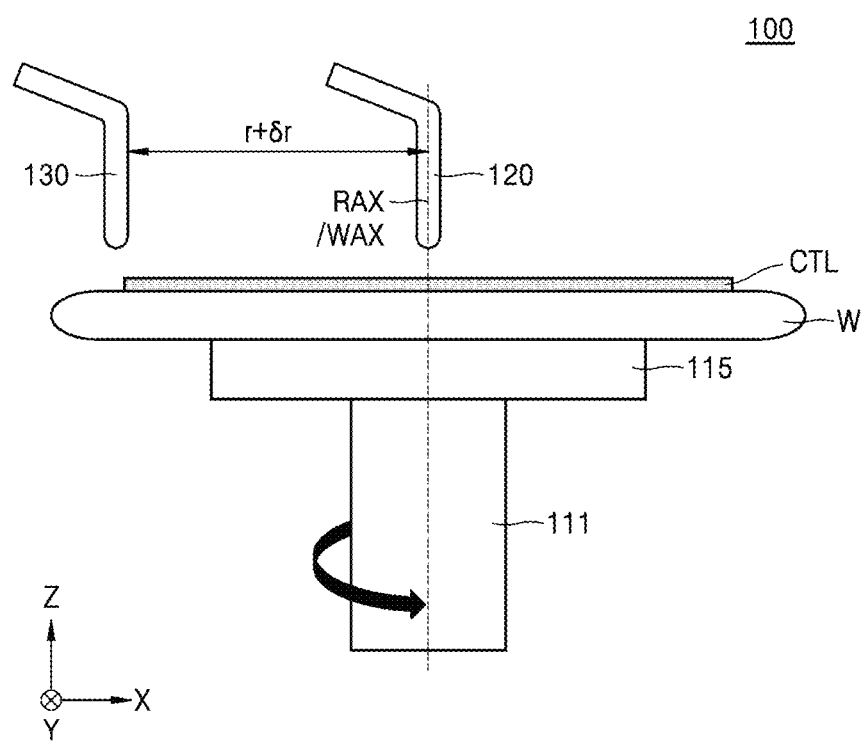
FIG. 3A is a cross-sectional view schematically illustrating a case in which a positional error occurs in a solution dispenser 130.
Figure 3B:
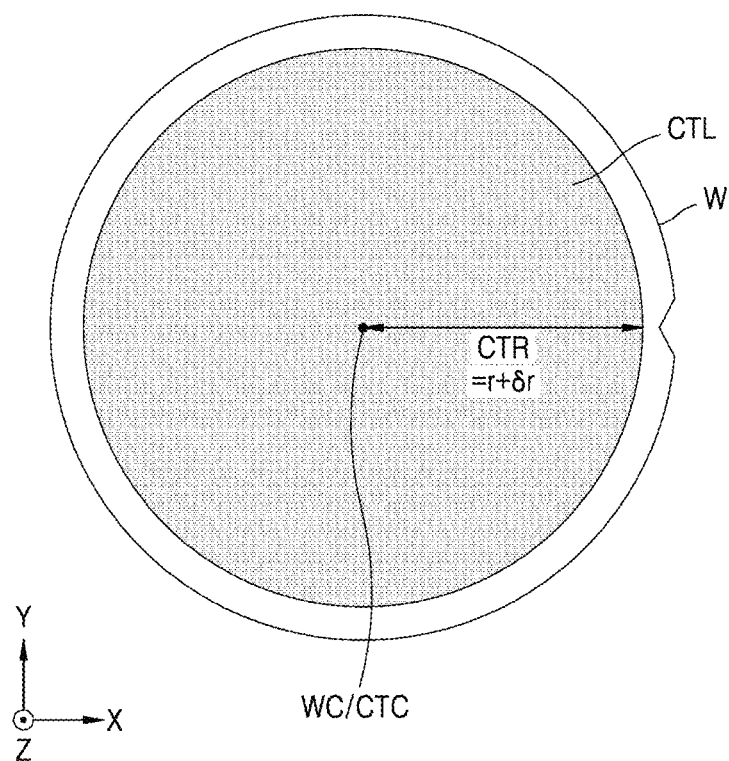
FIG. 3B is a plan view of a coating layer formed on a wafer according to the positional error in FIG. 3A.

FIG. 3A is a cross-sectional view illustrating a case in which the solution dispenser 130 is at a position different from the set radius r by a position error δr, and FIG. 3B is a plan view of the coating layer CTL formed on the wafer W according to the position error δr in FIG. 3A.

Figure 4A:
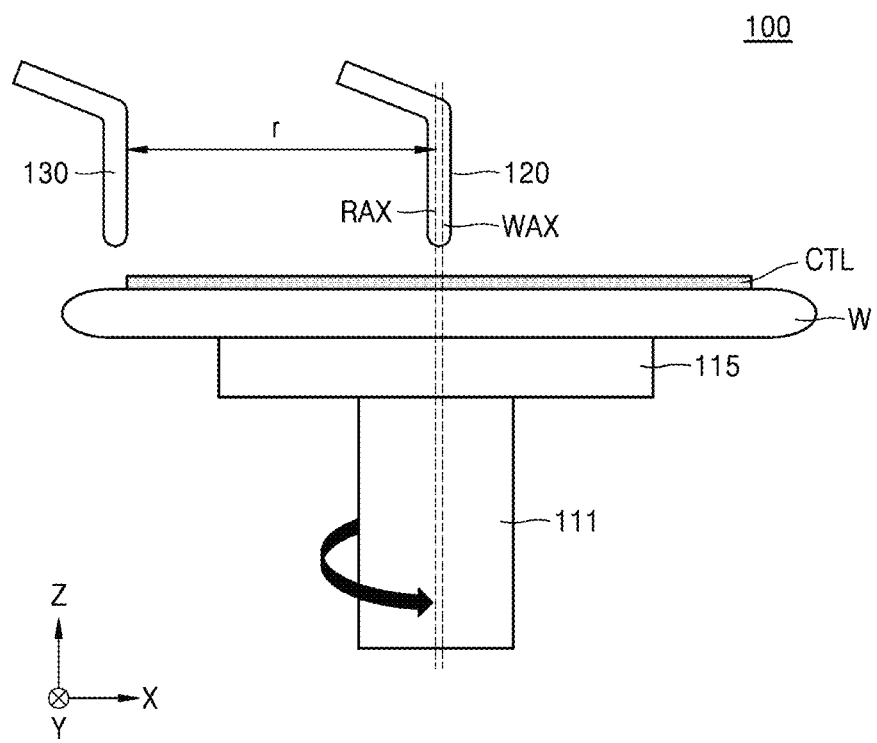
FIG. 4A is a cross-sectional view illustrating a case where a wafer is misaligned with respect to a chuck, and a central axis of a wafer and a rotation axis of a rotation driver do not match.
Figure 4B:
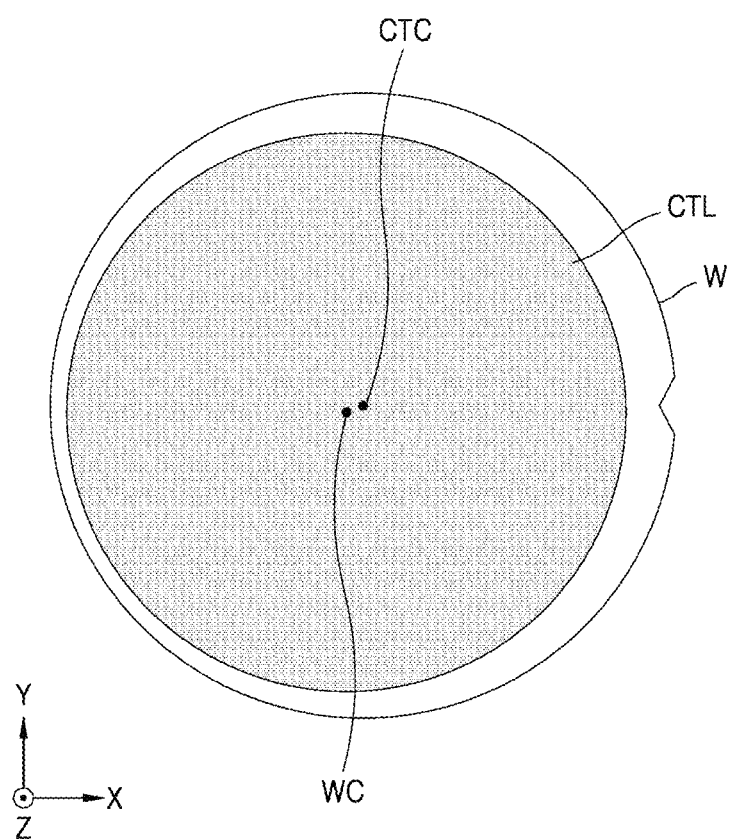
FIG. 4B is a plan view illustrating a coating layer formed on a wafer, according to a misalignment in FIG. 4A.
Figure 5A:
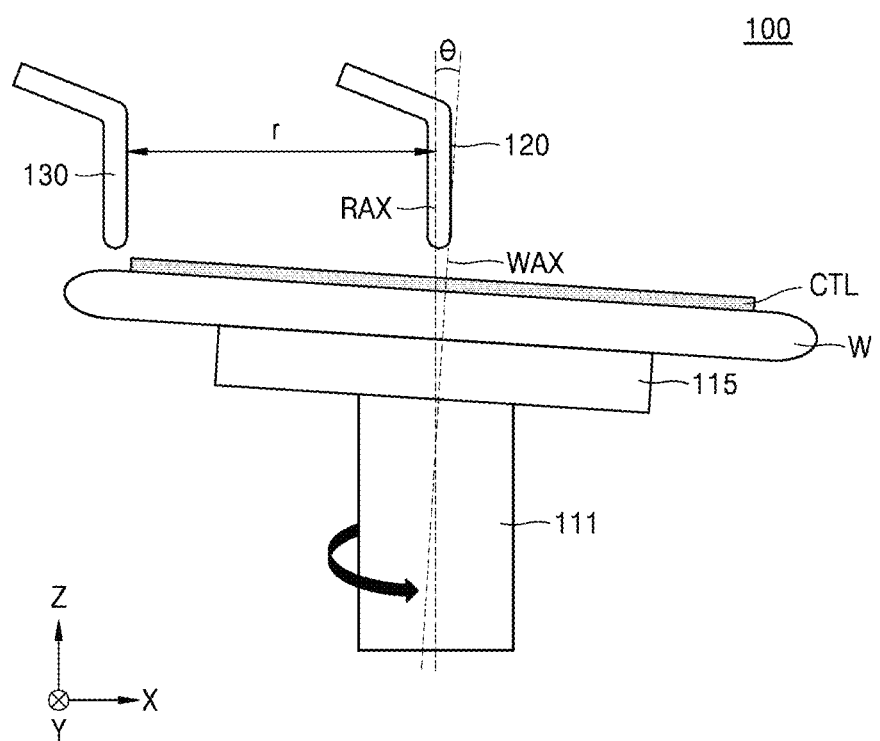
FIG. 5A is a cross-sectional view illustrating a case in which a chuck is inclined with respect to a rotation driver.
Figure 5B:
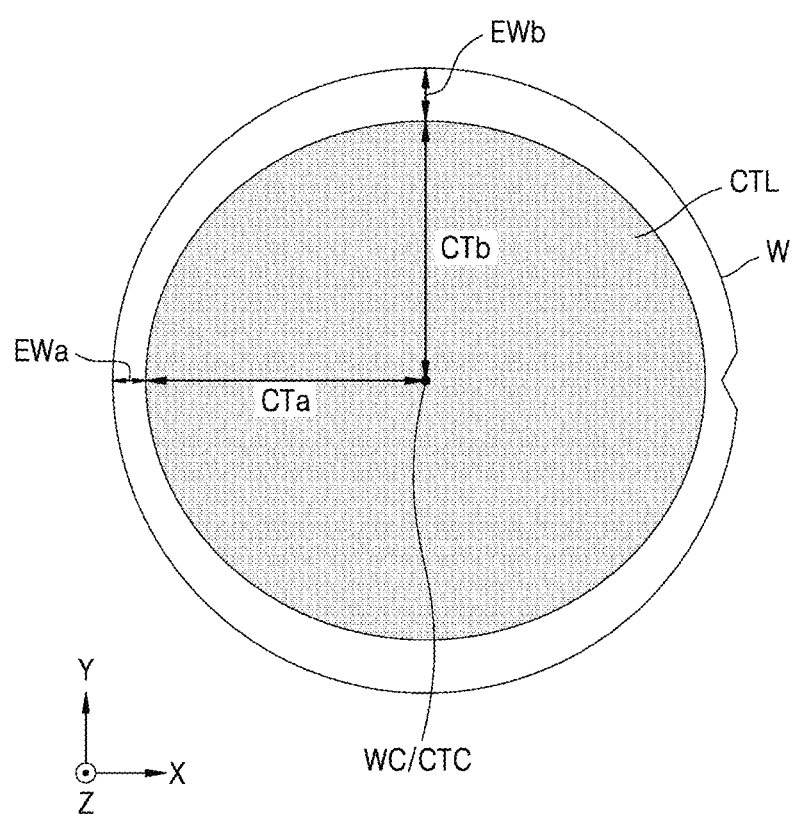
FIG. 5B is a plan view of a coating layer formed on a wafer, according to an inclination in FIG. 5A.

In FIG. 3B and FIGS. 4B and 5B, (which are referenced later) a direction connecting a notch from the center of the wafer W may be referred to as the X direction, and a direction perpendicular to the X direction may be referred to as the Y direction. In FIGS. 3B, 4B, and 5B, a wedge-shaped notch is illustrated as being formed on the wafer W, but is not limited thereto. For example, a D-shaped cut notch may be formed on the wafer W.

Referring to FIGS. 3A and 3B, the radius CTR of the coating layer CTL may have a radius changed by the position error δr from the set radius r of the solution dispenser 130. For example, when the solution dispenser 130 is closer to the center of the chuck 115 than the set radius r (that is, when the position error δr has a negative value), the radius CTR of the coating layer CTL may be less than the set radius r. As another example, when the solution dispenser 130 is farther from the center of the chuck 115 than the set radius r (that is, when the position error δr has a positive value), the coating layer (radius CTR of the CTL) may be larger than the set radius r.

FIG. 4A is a cross-sectional view illustrating a case where the wafer W is misaligned with respect to the chuck 115 and the central axis WAX of the wafer W and the rotation axis of the rotation driver 111 are inconsistent. FIG. 4B is a plan view illustrating the coating layer CTL formed on the wafer W according to the misalignment in FIG. 4A.

Referring to FIGS. 4A and 4B, due to the misalignment of the wafer W, a portion of the edges of the coating layer CTL may be over-etched and other portion may be too little etched, and thus a center CTC of the coating layer CTL may not coincide with a center WC of the wafer W.

FIGS. 5A and 5B are cross-sectional views illustrating the case in which the chuck 115 is inclined with respect to the rotation driver 111. FIG. 5B is a plan view of the coating layer CTL formed on the wafer W according to the inclination in FIG. 5A.

Referring to FIGS. 5A and 5B, the wafer W on the chuck 115 may also be tilted with respect to the rotation driver 111. Accordingly, an angle between the center axis WAX of the wafer W and the rotation axis RAX of the rotation driver 111 may have a non-zero angle θ.

When the center axis WAX of the wafer W is inclined with respect to the rotation driver 111, the exclusion width EW of the coating layer CTL to be removed by the solution SOL (refer to FIG. 2C) according to a degree of rotation of the wafer W may vary. For example, as illustrated in FIG. 5B, an exclusion width EWa in the X direction and an exclusion width EWb in the Y direction may be different from each other. As a result, when viewed from above, the coating layer CTL may have an elliptical shape in which the X direction is a major axis and the Y direction is a minor axis. A sum of a major semi-axis radius CTa and the exclusion width EWa in the X-direction may be substantially the same as a sum of a minor semi-axis radius CTb and the exclusion width EWb in the Y-direction, but is not limited thereto.

Figure 6:
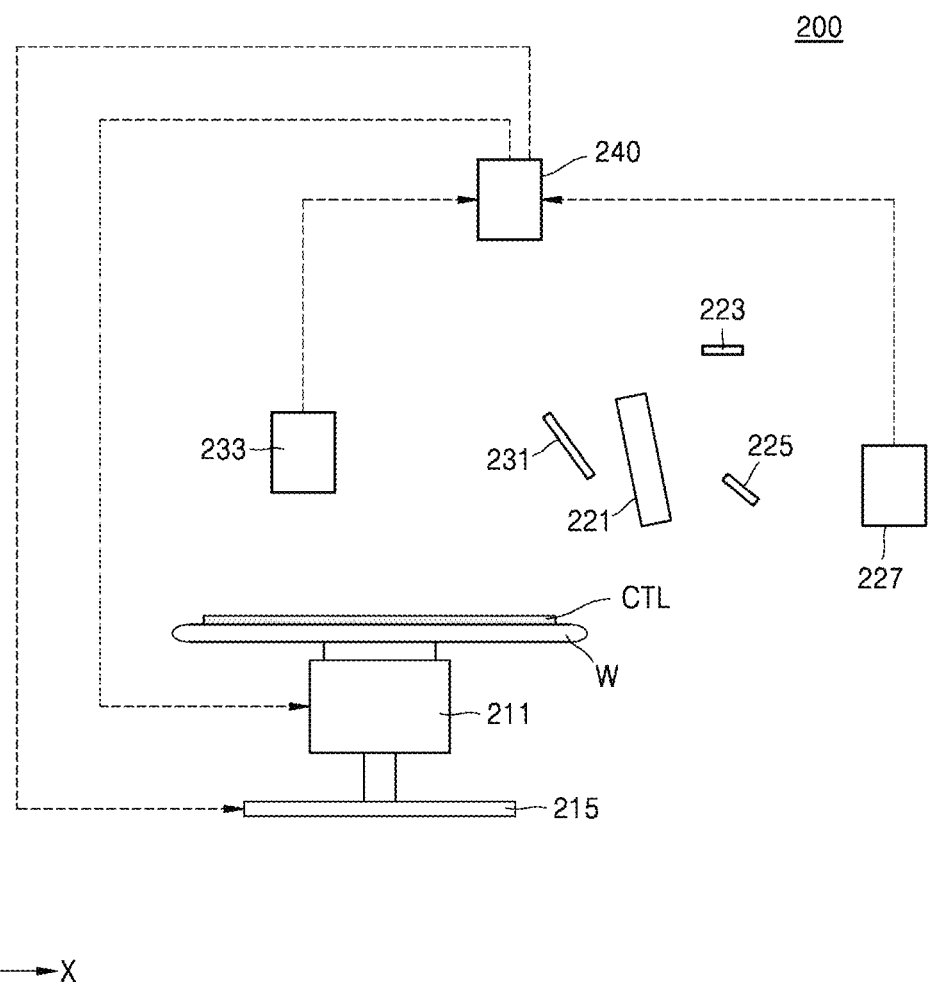
FIG. 6 is a schematic diagram of a plurality of coating layer inspectors in FIG. 1.

FIG. 6 is a schematic diagram of the coating layer inspector 200 in FIG. 1.

Referring to FIG. 6, the coating layer inspector 200 may include a rotation stage 211 and a line scan stage 215, a line scan light source 221, a first mirror 223, a second mirror 225, a third mirror 231, a line scan camera 227, an edge inspection camera 233, and an inspection controller 240.

The line scan light source 221, the first mirror 223 and the second mirror 225, and the line scan camera 227 may constitute a line scan optical system for inspecting the entirety of the coating layer CTL. The first mirror 223 and the second mirror 225 may include total reflection mirrors. As a result, a light loss rate of the line scan optical system may be less than that of a conventional optical system using a splitter, and thus an entire front image of a high quality of the coating layer CTL may be obtained.

The line scan optical system may include an oblique optical system. Accordingly, the line scan light source 221 may irradiate line scan illumination having an angle of about 60 degrees to about 90 degrees with respect to the top surface of the wafer W.

The third mirror 231 and the edge inspection camera 233 may constitute an edge inspection optical system for inspecting the edge portion of the coating layer CTL. In some cases, a lens system may be further arranged between the third mirror 231 and the edge inspection camera 233. The edge inspection optical system may include a vertical incident optical system.

The inspection controller 240 may control operations of the rotation stage 211, the line scan stage 215, the line scan light source 221, the first mirror 223, the second mirror 225, and the third mirror 231, the line scan camera 227, and the edge inspection camera 233. The inspection controller 240 may generate feedback signals based on inspection results of the line scan camera 227 and the edge inspection camera 233. The inspection controller 240 may determine the quality of the coating layer CTL from the inspection results of the line scan camera 227 and the edge inspection camera 233. The inspection controller 240 may determine whether it is necessary to re-perform the spin coating process and the EBR process according to the quality of the coating layer CTL.

According to example embodiments, the inspection controller 240 may be implemented in hardware, firmware, software, or any combination thereof. According to example embodiments, the operation of the inspection controller 240 may be implemented as instructions stored on a machine readable medium that may be read and executed by one or more processors. The machine-readable medium may include any mechanism for storing and/or transmitting information in a form readable by a machine (for example, a computing device). For example, the machine-readable medium may include read-only memory (ROM); random access memory (RAM); magnetic disk storage media; optical storage media; flash memory devices; electrical, optical, acoustical or other forms of propagated signals (for example, carrier waves, infrared signals, and digital signals); and any other signals. In addition, firmware, software, routines, instructions may be configured to perform the operations described with respect to the inspection controller 240, or any of the processes described below. However, this is for convenience of explanation, and it should be understood that the operation of the inspection controller 240 described above may be caused by a computing device, a processor, a controller, or other device that executes firmware, software, routines, instructions, and the like.

Figure 7A:
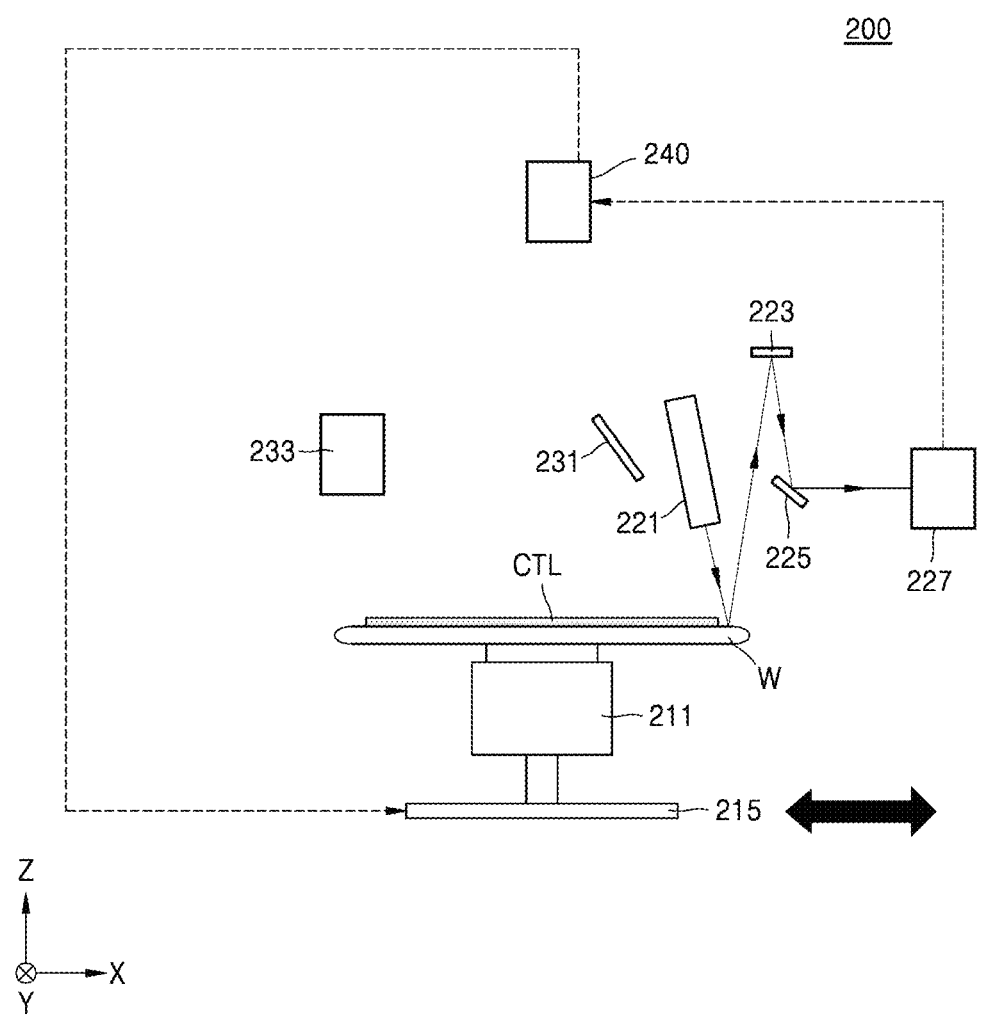
FIGS. 7A and 7B are schematic diagrams for describing an operation of a coating layer inspector.
Figure 7B:
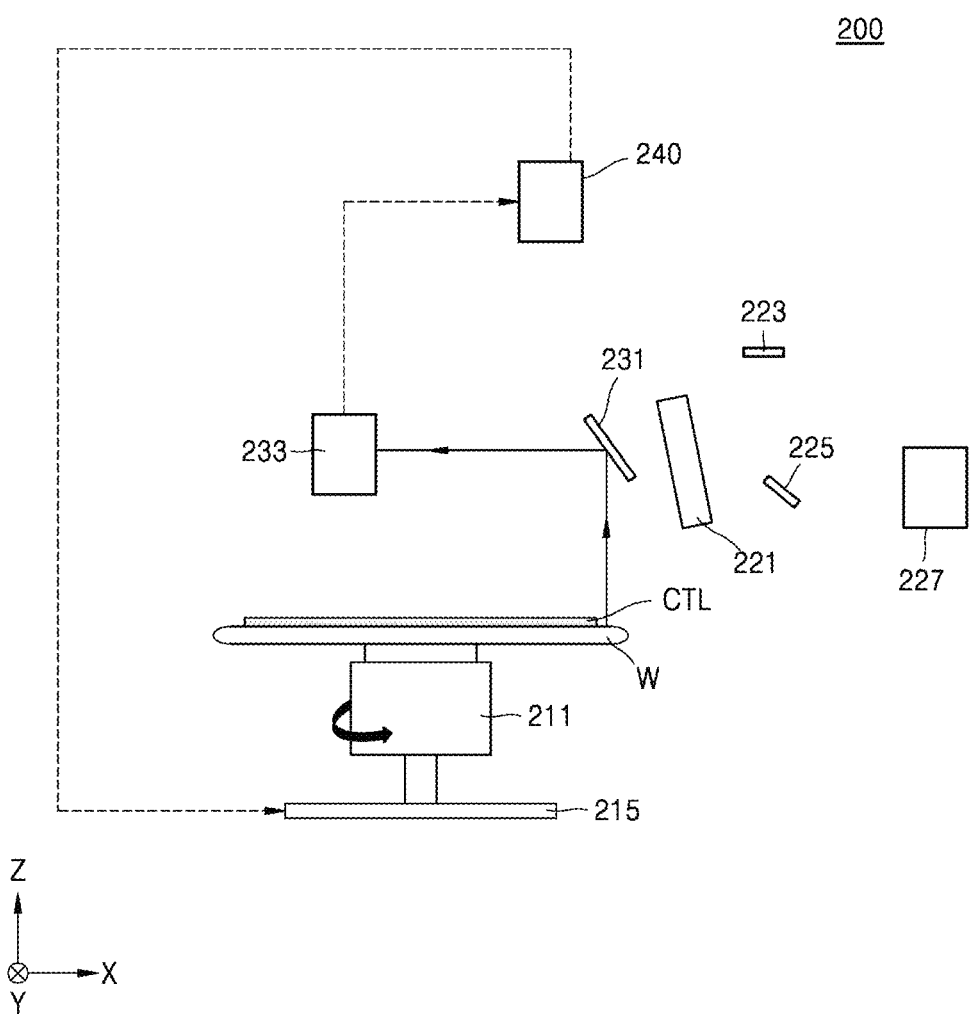

FIGS. 7A and 7B are schematic diagrams for describing an operation of the coating layer inspector 200. FIG. 7A is a drawing illustrating a line scan inspection of the coating layer inspector 200, and FIG. 7B is a diagram illustrating an inspection of the EBR of the coating layer inspector 200.

In FIGS. 7A and 7B, dashed arrows may indicate transmission of signals and/or commands, and solid arrows may indicate paths of movement of light.

Referring to FIG. 7A, the line scan stage 215 may move in a horizontal direction (for example, the X direction) according to a control signal of the inspection controller 240. The line scan light source 221 may irradiate line scan illumination onto the top surface of the wafer W. The line scan illumination may be reflected on the top surface of the wafer W and the top surface of the photoresist layer CTL, may be reflected by the first mirror 223 and the second mirror 225, and may reach the line scan camera 227. The line scan camera 227 may obtain a bright field image of the front surface of the wafer W and the control layer CTL.

Line scanning may be performed twice. A position of the notch of the wafer W may be determined from the image of the front surface of the wafer W in a first scanning. Based on the position of the notch of the wafer W determined by the first scanning, the rotation stage 215 may align the notch of the wafer W in the X direction or the Y direction. Thereafter, a second scanning may be performed on the aligned wafer W. The inspection controller 240 may determine the defects (for example, streak defects) on the front side of the coating layer CTL by using the images of the wafer W and the front side of the coating layer CTL obtained in the secondary scanning.

The inspection controller 240 may determine the presence or absence of a defect in the coating layer CTL by comparing with existing measurement results for the wafer W on which the coating layer CTL without defects is formed.

Next, referring to FIG. 7B, the edge portion of the wafer W and the coating layer CTL on the edge portion may be inspected. The inspection controller 240 may control a rotation of the wafer W by the rotation stage 211. The edge inspection camera 233 may obtain bright field images of the edge portions of the wafer W and the control layer CTL in response to a rotation by the rotation stage 211.

The edge inspection camera 233 may obtain images of the edges of the wafer W and the control layer CTL corresponding to certain angles based on the notch of the wafer W. The edge inspection camera 233 may obtain images of the edges of the wafer W and the control layer CTL corresponding to equally divided angles. For example, the edge inspection camera 233 may rotate by about 45° with the notch as a reference angle (for example, about) 0°, and may obtain eight edge images.

According to example embodiments, the edge inspection camera 233 may obtain rotation scan images by continuously photographing the edge of the wafer W according to the rotation of the rotation stage 211.

In the above description, the edge inspection may be performed after the line scanning is performed, but the embodiment is not limited thereto. For example, the line scanning may be performed after the edge inspection is performed. In addition, after the first line scanning is performed to determine the notch, it may also be possible to perform a rotational scanning and again perform the second line scanning.

Figure 8:
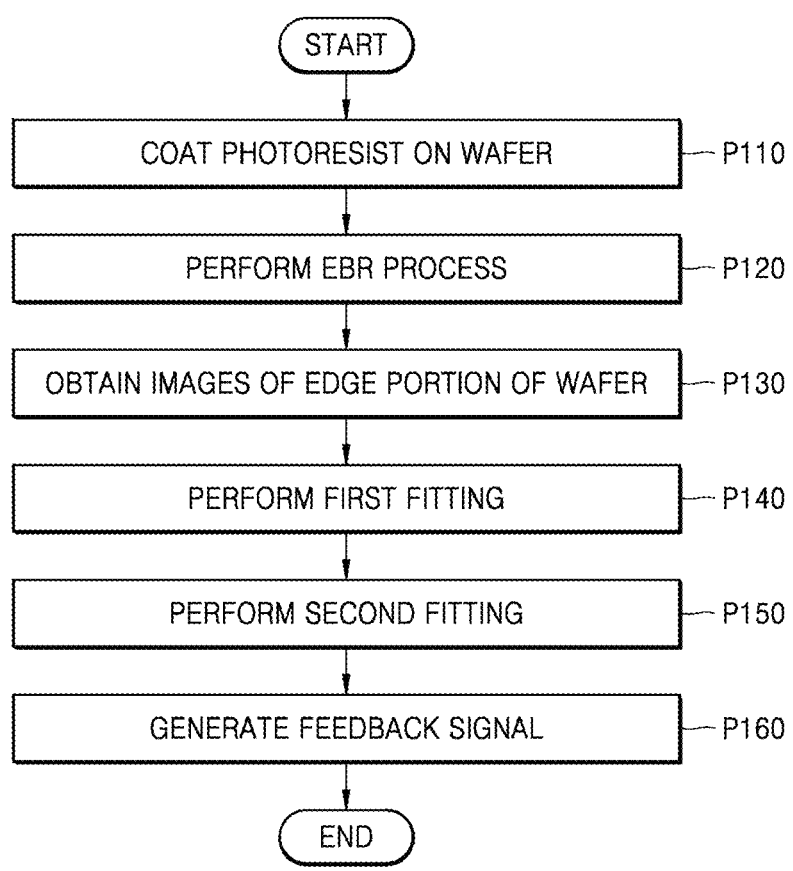
FIG. 8 is a flowchart of a wafer manufacturing method according to example embodiments.

FIG. 8 is a flowchart of a wafer manufacturing method according to example embodiments.

Referring to FIGS. 8, 2A, 2B and 2C, the coating layer CTL may be formed on the wafer W (P110), and the EBR process may be performed (P120).

According to the example embodiments illustrated in FIG. 8, formation of the coating layer CTL and the EBR process are substantially the same as described above with reference to FIGS. 2A, 2B and 2C, and thus detailed description thereof is omitted.

Figure 9:
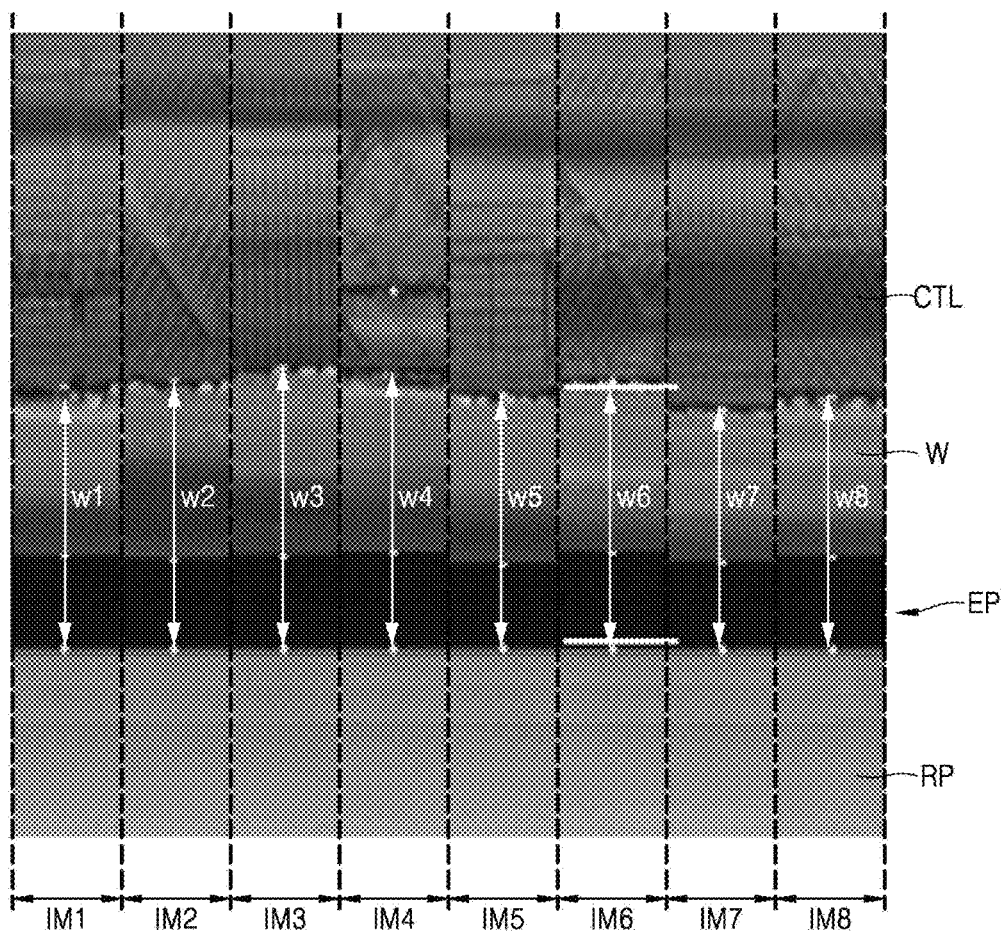
FIG. 9 illustrates bright field images of edge portions of a wafer obtained according to experimental examples.

FIG. 9 illustrates bright field images of the edge portion of the wafer W obtained according to experimental examples.

Referring to FIGS. 7B, 8, and 9, images of edge portions of the wafer W may be obtained (P130).

Referring to FIG. 9, in the experimental example, first through eighth images IM1 through IM8 that are images of the edge portions of the wafer W may be obtained, sequentially rotating at a certain angular interval (for example, about 45°). This rotation may be started from the notch of the wafer W.

Although eight images have been obtained in the present experimental example, the technical spirit of the disclosure is not limited thereto. Those of ordinary skill in the art will easily apply the contents described below in a substantially same manner even to cases in which three to seven edge images of the wafer W or nine or more edge images of the wafer W are obtained.

As described above, because end portions EP of the wafer W having a round shape or a bevel shape cause scattering of light, corresponding portions of the first through eighth images IM1 through IM8 may be dark. Accordingly, a reflecting plate RP may be arranged under the wafer W, and a boundary of the end portion EP of the wafer W may be determined by the reflecting plate RP. According to example embodiments, based on the determined end portion EP of the wafer W, first through eighth widths w1 through w8 that are respectively the exclusion width EW (refer to FIG. 2C) of the first through eighth images IM1 through IM8 in order.

According to example embodiments, the first through eighth images (i.e., IM1 through IM8) may have certain widths. For example, widths (lateral widths in the drawing) of the first through eighth images IM1 through IM8 may be about 500 but are not limited thereto.

According to example embodiments, each of the first through eighth widths w1 through w8 may be determined as each of averages of the exclusion widths EW (refer to FIG. 2C) in the first through eighth images IM1 through IM8. In other embodiments, each of the first through eighth widths w1 through w8 may be determined as the exclusion widths EW (refer to FIG. 2C) corresponding to each of the centers of the images of the first through eighth images IM1 through IM8, respectively.

Figure 10:
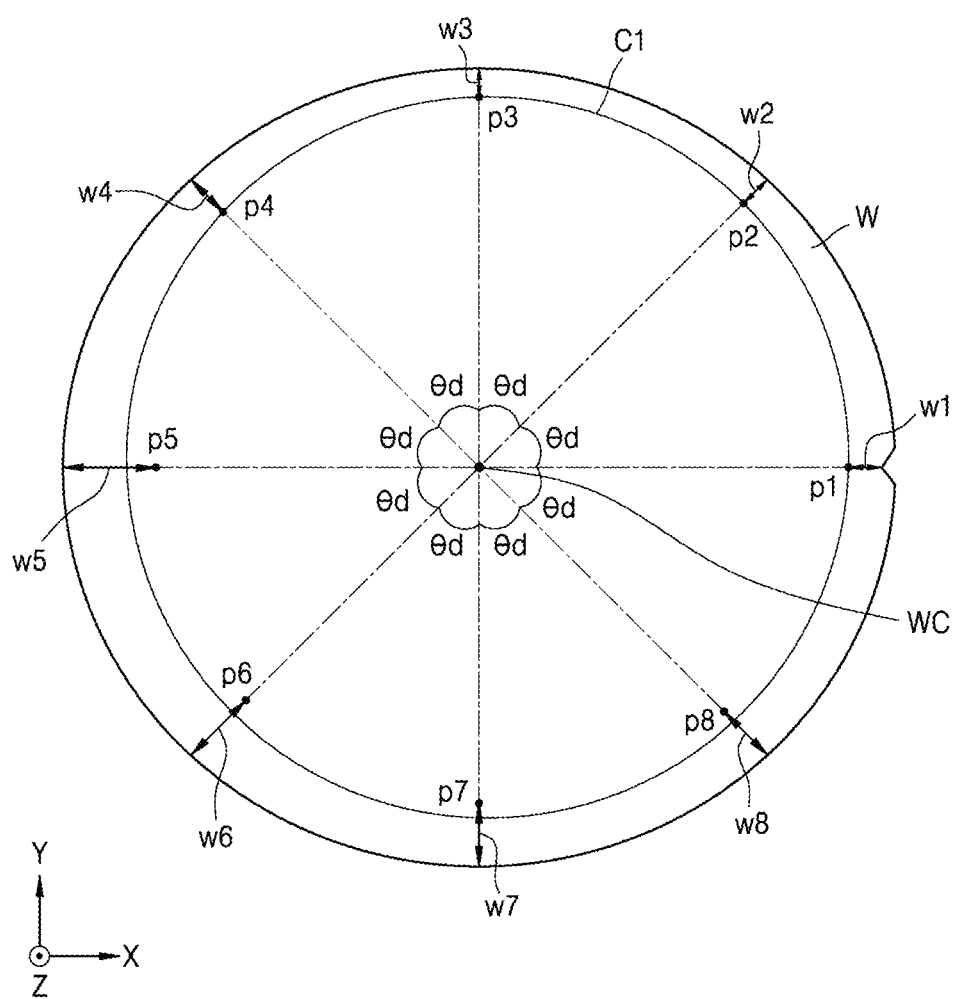
FIGS. 10, 11 and 12 are schematic conceptual diagrams illustrating a wafer manufacturing method, according to example embodiments.
Figure 11:
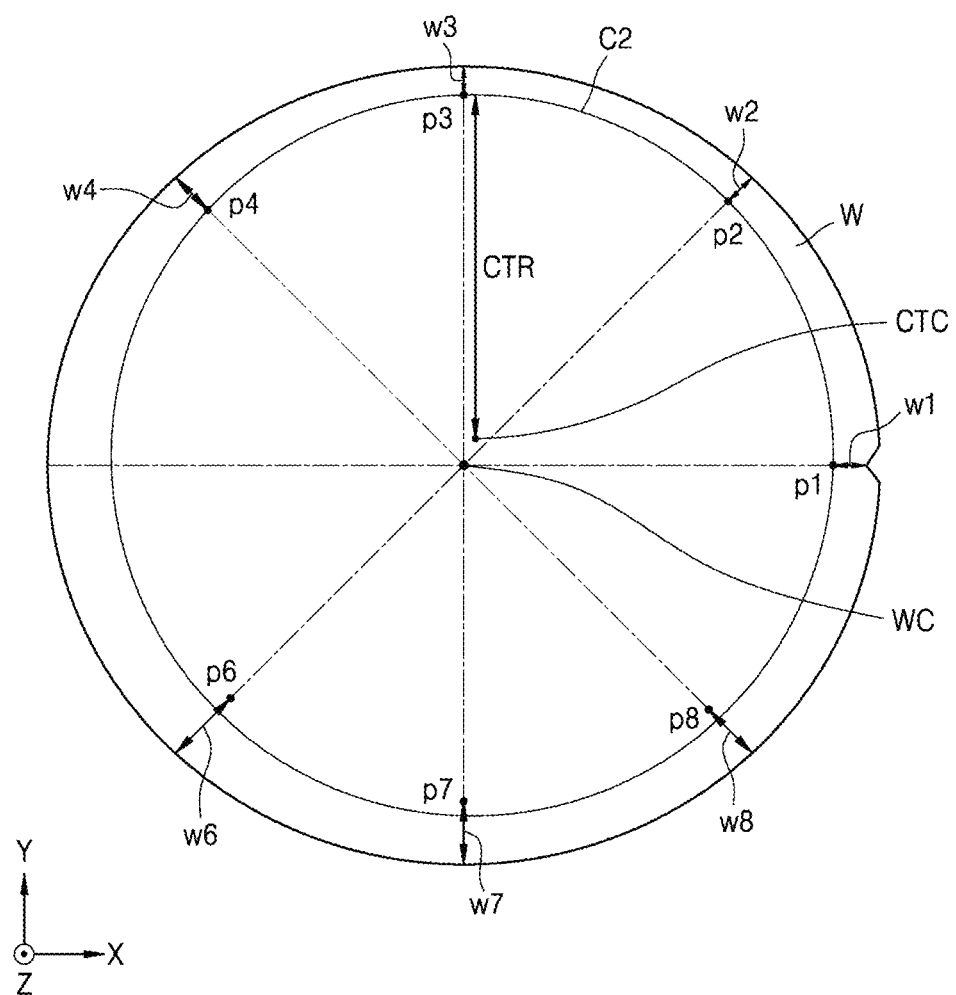
Figure 12:
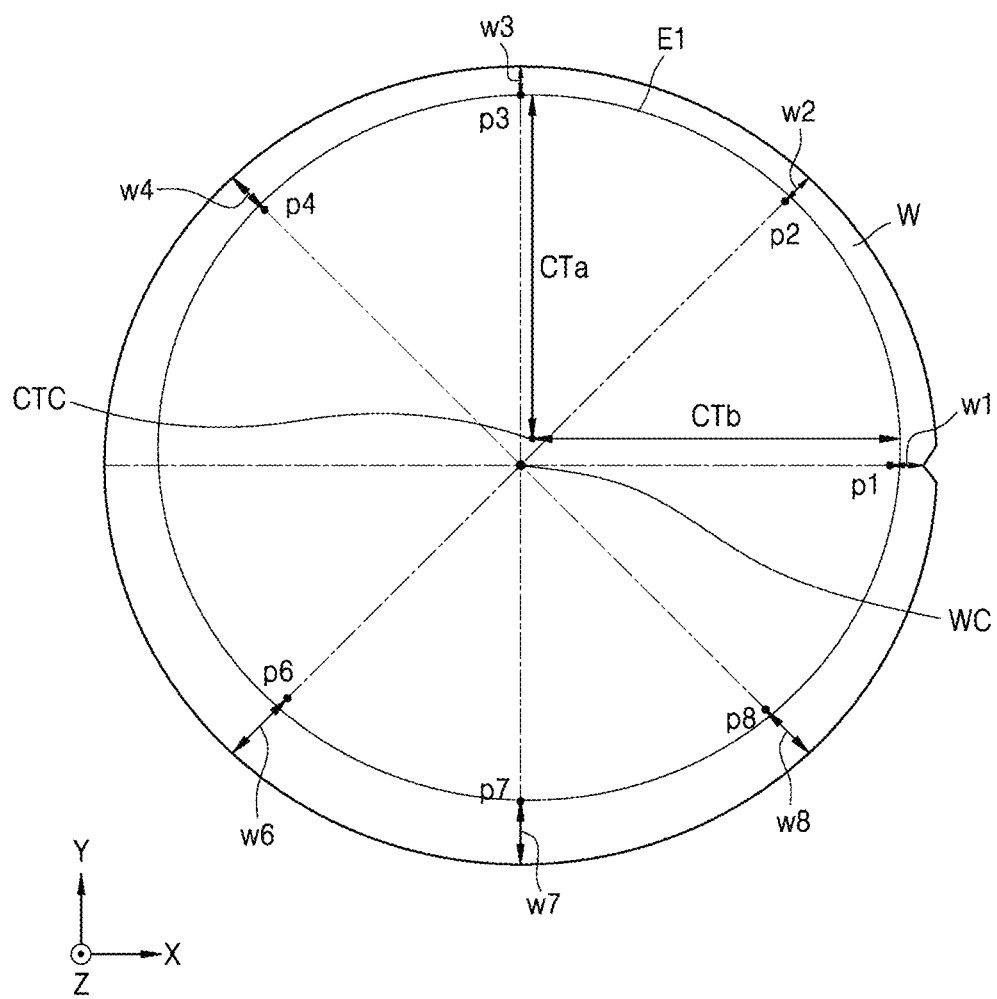

FIGS. 10, 11 and 12 are schematic diagrams illustrating a manufacturing method of a wafer, according to example embodiments. FIG. 10 illustrates a first circle fitting that is a result of the first fitting of operation P140, and FIGS. 11 and 12 illustrate a second circle fitting and an ellipse fitting included in the second fitting of operation P150.

Subsequently, referring to FIGS. 7B, 8, and 10, the inspection controller 240 may perform the first fitting in operation P140.

The inspection controller 240 may, based on angles of the first through eighth widths w1 through w8 and the first through eighth images IM1 through IM8 with respect to the notch, determine positions of first through eighth positions p1 through p8 which are positions of points on the wafer W that constitute the boundary between the wafer W and the control layer CTL in the first through eighth images (i.e., IM1 through IM8).

A first position p1 may correspond to the notch of the wafer W. Accordingly, an azimuth of the first position p1 may be defined as, for example, about 0°. Second through eighth positions p2 through p8 may be subsequent positions rotated by about 45° from the notch. In other words, an azimuth Od in FIG. 10 may be about 45°. The first through eighth positions p1 through p8 may be apart from the circumference of the wafer W by the first through eighth widths w1 through w8 in a direction of the center WC of the wafer W, respectively.

The first fitting may include the first circle fitting that fits the first to eighth positions p1 through p8 into the first circle C1. The first fitting may be performed by any fitting method such as a method of least squares.

After determining the first circle C1 determined according to the first fitting in operation P140 is completed, a position farthest away from the first circle C1 may be excluded in a subsequent analysis. In FIG. 10, the fifth position p5 that is furthest from the circumference of the first circle C1 may be excluded in the second fitting of operation P150 thereafter. However, the example embodiment is not limited thereto, and operation P140 may be omitted in some cases. In this case, the second fitting may be based on all images obtained by the edge inspection camera 233. In other words, the second fitting may include the second circle fitting and the ellipse fitting of the first through eighth positions p1 through p8.

Subsequently, referring to FIGS. 7B, 8, 11, and 12, the inspection controller 240 may perform the second fitting in operation P140.

The second fitting may include the second circle fitting that fits the first through fourth positions (i.e., p1 to p4) and the sixth through eighth positions (i.e., p6 to p8) onto a circle, and an ellipse fitting that fits the first through fourth positions (i.e., p1 to p4) and the sixth through eighth positions (i.e., p6 to p8) onto an ellipse.

Referring to FIG. 11, according to the circle fitting included in the second fitting, a second circle C2 according to Formula 1 below may be defined.

$$(x - \delta x_{ecc})^2 + (y - \delta y_{ecc})^2 = (CTR)^2 = (r + \delta r)^2 \quad \text{[Formula 1]}$$

Here, x and y may be coordinates in the X direction and the Y direction, respectively, with the center of the wafer as the origin, $\delta x_{ecc}$ and $\delta y_{ecc}$ may be coordinates of the center of the second circle C2, and the radius CTR may be a radius of the second circle C2.

The inspection controller 240 may determine a position deviation $\delta r$ of the solution dispenser 130 (refer to FIG. 3A) from the radius CTR and the set radius r of the second circle C2. When the position deviation $\delta r$ is not zero, the inspection controller 240 may determine that the solution dispenser 130 deviates from the set radius r by the position deviation $\delta r$ as illustrated in FIG. 3A.

When $\delta x_{ecc}$ and $\delta y_{ecc}$ is not at zero (0) or at about 0, the inspection controller 240 may determine that, as illustrated in FIG. 4A, the center WC of the wafer W is misaligned in the X direction by $-\delta x_{ecc}$ and in the Y direction by $-\delta y_{ecc}$ from the center of the chuck 115 in the spin coating process.

Referring to FIG. 11, according to the ellipse fitting included in the second fitting, an ellipse El according to Formula 2 below may be defined.

$$\left(\frac{x - \delta x_{ecc}}{\delta x_{level}}\right)^2 + \left(\frac{y - \delta y_{ecc}}{\delta y_{level}}\right)^2 = (r + \delta r)^2 \quad \text{[Formula 2]}$$

Both $\delta x_{level}$ and $\delta y_{level}$ may be determined by a first radius CTa and a second radius CTb of the ellipse El, and may satisfy Formula 3 below with respect to the set radius r.

$$PRa = \delta x_{level}(r + \delta r), PRb = \delta y_{level}(r + \delta r) \quad \text{[Formula 3]}$$

When a ratio of $\delta x_{level}$ over $\delta y_{level}$ is not about 1, the inspection controller 240 may determine that, as illustrated in the spin coating process in FIG. 5A, the chuck 115 and the wafer W thereon are inclined by the angle θ with respect to the rotation axis RAX of the rotation driver 111.

The inspection controller 240 may calculate the angle θ by using $\delta x_{level}$, $\delta y_{level}$, and Formula 4 below.

$$\theta = \arccos\left(\frac{\min(\delta x_{level}, \delta y_{level})}{\max(\delta x_{level}, \delta y_{level})}\right) \quad \text{[Formula 4]}$$

According to an example embodiment, the circle fitting and the ellipse fitting may be performed simultaneously. According to another example embodiment, it may also be possible that the ellipse fitting is performed after the circle fitting is performed first, or that the ellipse fitting is performed after the ellipse fitting is performed first.

Subsequently, referring to FIG. 8, in operation P160, the inspection controller 240 may generate a feedback signal for the inspection result (for example, the second fitting result) of the wafer edge portion.

An adjustment of the photoresist coating process may be performed by the control of the wafer processing apparatus (refer to FIG. 1) based on the feedback signal generated by the inspection controller 240. The process feedback may include feedbacks for the spin coating process and the EBR process.

The feedback signal may be based on either the inspection result (for example, the second fitting result) for the wafer W and the inspection result (for example, the second fitting result) for a lot including a plurality of wafers W. However, the embodiment is not limited thereto, and the feedback signal may be based on an inspection result (for example, the second fitting result) of a set number (for example, tens to hundreds) of the wafers W.

The feedback signal of the inspection controller 240 may be generated based on a period of a process reliability test. The feedback signal generated by the inspection controller 240 may affect the performance of the spin coating process on the wafer W.

According to an example embodiment, referring to FIG. 2A, based on the position deviation $\delta r$, the inspection controller 240 may generate a first feedback signal for adjusting the position of the solution dispenser 130 such that the solution dispenser 130 is correctly located at the set radius r. The inspection controller 240 may transmit the first feedback signal to the spin coater 100 (refer to FIG. 1) and/or a supervisory control system. The driving apparatus may arrange the solution dispenser 130 at the set radius r according to the first feedback signal.

According to another example embodiment, inspection controller 240 may, based on values of $\delta x_{ecc}$ and $\delta y_{ecc}$, generate a second feedback signal for adjusting the alignment of the wafer W and the chuck 115 by using the transfer robot 510 (refer to FIG. 1). The inspection controller 240 may transmit the second feedback signal to the transfer robot 510 (refer to FIG. 1) and/or the supervisory control system. By the second feedback signal, the operation of the transfer robot 510 (refer to FIG. 1) for mounting the wafer W on the chuck 115 may be adjusted.

According to another example embodiment, the inspection controller 240 may generate a third feedback signal for adjusting an angular alignment of the chuck 115 and the rotary driver 111, based on the angle θ. The inspection controller 240 may transmit the third feedback signal to the spin coater 100 (refer to FIG. 1) and/or the supervisory control system. By the third feedback signal, the angular alignment of the chuck 115 may be adjusted such that the chuck 115 is perpendicular to the rotation axis RAX of the rotation driver 111.

According to some example embodiments, the first through third feedback signals may be generated in real time for adjusting the position of the solution dispenser 130, adjusting the alignment between the wafer W and the chuck 115, and adjusting the angular alignment between the chuck 115 and the rotation driver 111. According to example embodiments, since generation of the feedback signal is performed substantially simultaneously with a quality inspection of the coating layer CTL formed on the wafer W, a separate inspection process may not be required, and thus a feedback on the spin coating process may be possible without increasing a tact time.

Figure 13:
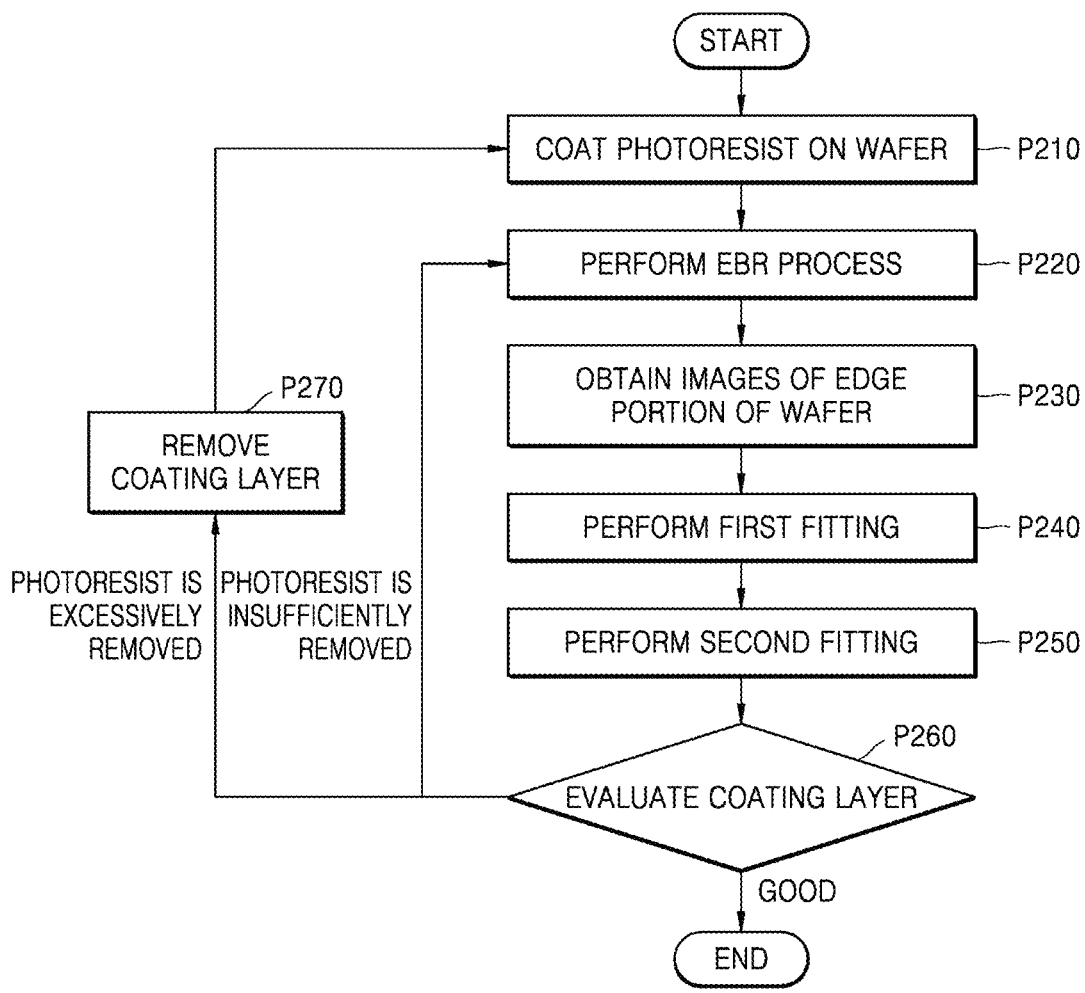
FIG. 13 is a flowchart of a method of manufacturing a semiconductor device, according to other example embodiments.

FIG. 13 is a flowchart of a manufacturing method of a semiconductor device, according to other example embodiments.

Operations P210 through P250 in FIG. 13 are substantially the same as operations P110 through P150 in FIG. 8.

For convenience of description, duplicate descriptions given with reference to FIG. 8 are omitted and differences are mainly described.

Referring to FIGS. 6 and 13, the inspection controller 240 may evaluate the coating layer CTL (P260). The inspection controller 240 may evaluate the spin coating process and the EBR process for forming the coating layer CTL.

For example, evaluation of the EBR process may include determining eccentricity, a radius, existence of an elliptic shape of the coating layer CTL on which the EBR process has been performed. According to example embodiments, the inspection controller 240 may calculate the number of chips that are producible from the coating layer CTL. The inspection controller 240 may determine whether the coating layer CTL has been excessively etched by comparing the number of producible chips with a threshold. The inspection controller 240 may determine whether the edge beads EB (refer to FIG. 2B) have been sufficiently removed from the coating layer CTL.

When the edge beads EB (see FIG. 2B) are completely removed and the coating layer CTL is excessively removed, the inspection controller 240 may generate a signal for recoating the coating layer CTL. In this case, after the coating layer CTL is removed by using a strip process (P270), operation P210 may be performed again. As a result, the yield of manufacturing a single semiconductor device may be improved.

If the edge beads EB (see FIG. 2B) are completely removed and the coating layer CTL is not excessively removed, the inspection controller 240 may terminate the inspection and generate a signal for subsequent process performance.

When the edge beads (EB, see FIG. 2B) have not been removed completely, but have been sufficiently removed to be removed by the edge cleaners 250 (refer to FIG. 1), the inspection controller 240 may terminate the inspection and generate a signal for subsequent process performance.

When the coating layer CTL is not sufficiently removed and the edge beads EB (see FIG. 2B) may not be removed by the edge cleaners 250 (refer to FIG. 1), operation P220 may be performed for the EBR process.

According to another example embodiment of the disclosure, there is provided an apparatus including a memory storing one or more instructions and a processor configured to execute the one or more instructions to obtain a plurality of images of edge portions of a wafer provided on a chuck, the edge portions corresponding to a plurality of azimuths of the wafer, identify exclusion widths with respect to the plurality of azimuths on the wafer based on the plurality of images of the edge portions, the exclusion widths corresponding to portions of a top surface of the wafer that is not covered by a coating layer, identify, based on the exclusion widths and the plurality of azimuths, a feature of at least a portion the coating layer in a top view and generate a control signal to adjust a process for forming the coating layer based on the feature of the at least the portion the coating layer in the top view.

According to an example embodiment, the feature of the at least the portion the coating layer in the top view may include eccentricity, a radius or existence of an elliptic shape of the coating layer.

According to an example embodiment, the processor may identify whether the feature of the at least the portion the coating layer in the top view is deviated from a reference value more than a threshold value; and generate the control signal based on the identification that the feature of the at least the portion the coating layer in the top view is deviated from the reference value more than the threshold value.

While the disclosure has been particularly shown and described with reference to example embodiments thereof, it will be understood that various changes in form and details may be made therein without departing from the spirit and scope of the following claims.

What is claimed is:

1. A semiconductor device manufacturing system comprising:
a spin coater configured to form a coating layer on a wafer; and
a coating layer inspector configured to inspect the coating layer,
wherein the spin coater comprises:
a chuck with a central axis, wherein the chuck is configured to support the wafer and is tiltable such that an orientation of the central axis changes;
a coating material dispenser configured to provide a coating material to a top surface of the wafer;
a rotation driver with a rotation driver axis configured to rotate the chuck about the rotation driver axis such that the coating material is coated on the wafer to form the coating layer; and
a solution dispenser configured to dispense a solution to a portion of the coating layer formed on an edge portion of the wafer,
wherein the coating layer inspector comprises:
an edge inspection camera configured to obtain a plurality of images of edge portions of the wafer; and
an inspection controller configured to identify one of a radius, eccentricity, or a top-view shape of the coating layer, based on the plurality of images of the edge portions of the wafer,
wherein the inspection controller is further configured to identify exclusion widths based on the plurality of images of the edge portions, the exclusion widths being radial widths of portions of the wafer from which the coating layer has been removed,
wherein the edge inspection camera is further configured to obtain the plurality of images of the edge portions corresponding to a plurality of azimuths of the wafer,
wherein the inspection controller is further configured to identify, based on the exclusion widths and the plurality of azimuths, positions of a contour of the coating layer on the wafer,
wherein the inspection controller is further configured to fit the positions of the contour into an ellipse,
wherein the inspection controller is further configured to determine a major semi-axis of the ellipse, a minor semi-axis of the ellipse, a radius of the major semi-axis, and a radius of the minor semi-axis, and
wherein the inspection controller is configured to determine an angle between the central axis of the chuck and the rotation driver axis using a first exclusion width along the major semi-axis of the ellipse, a second exclusion width along the minor semi-axis of the ellipse, the radius of the major semi-axis, and the radius of the minor semi-axis, such that a sum of the radius of the major semi-axis and the first exclusion width is substantially the same as a sum of the radius of the minor semi-axis and the second exclusion width.

2. The system of claim 1, wherein
the inspection controller is further configured to fit the positions of the contour into a circle.

3. The system of claim 2, wherein
the inspection controller is further configured to identify the eccentricity and the radius of the coating layer based on a circle fitting.
4. The system of claim 3, wherein
the inspection controller is further configured to generate, based on the radius of the coating layer, a first feedback signal for adjusting a position of the solution dispenser.
5. The system of claim 3, further comprising a transfer robot configured to mount the wafer on the chuck,
wherein the inspection controller is further configured to generate, based on the eccentricity, a second feedback signal for adjusting mounting of the transfer robot.
6. The system of claim 1, wherein
the inspection controller is further configured to generate, based on the major semi-axis and the minor semi-axis, a third feedback signal for adjusting an angular alignment of the chuck and the rotation driver.

\* \* \* \* \*